United States Patent [19]

Gerlach

[11] 4,185,252
[45] Jan. 22, 1980

[54] MICROSTRIP OPEN RING RESONATOR OSCILLATORS

[75] Inventor: Horst W. A. Gerlach, Bethesda, Md.

[73] Assignee: The United States of America as represented by the Secretary of the Army, Washington, D.C.

[21] Appl. No.: 904,698

[22] Filed: May 10, 1978

[51] Int. Cl.² .................. H03B 7/14; H03B 9/12; H03H 13/00
[52] U.S. Cl. .................. 331/56; 331/99; 331/107 P; 331/107 SL; 333/128; 333/219; 333/247
[58] Field of Search ............ 331/96, 99, 107 SL, 331/107 G, 107 P, 56; 333/82 R, 84 M, 11, 128, 238, 246, 247, 219

[56] References Cited

U.S. PATENT DOCUMENTS 4,121,182  10/1978  Makimoto et al. ........... 333/84 M X

FOREIGN PATENT DOCUMENTS 2448544  5/1975  Fed. Rep. of Germany ........ 333/82 R

OTHER PUBLICATIONS de Ronde et al., "MIC Bandfilters Using Open-Ring Resonators", Proc. 4th European Microwave Conf., Montreux, France, Sep. 1974, pp. 531-535.

Primary Examiner—Siegfried H. Grimm
Attorney, Agent, or Firm—Nathan Edelberg; Robert P. Gibson; Saul Elbaum

[57] ABSTRACT

A microstrip circuit which features a pair of open ring resonators sections adapted to oscillate independently in their even mode. In a preferred form, the ring resonator sections are each driven by a TRAPATT diode, and include a load circuit which combines the individual power outputs to a common load. Tuning stubs and the like may be provided to reactively trap harmonics in order to initiate the desired TRAPATT mode, and additional ring resonators may be interposed between the driving circuit and the load to filter the fundamental frequency, if desired. Other configurations permit power to be combined from two or more sets of dual ring resonators.

28 Claims, 12 Drawing Figures

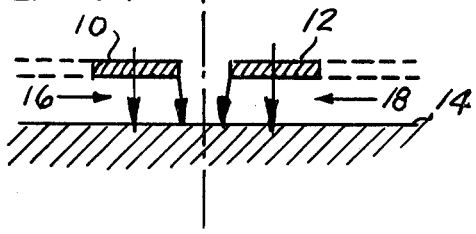
FIG. 1.
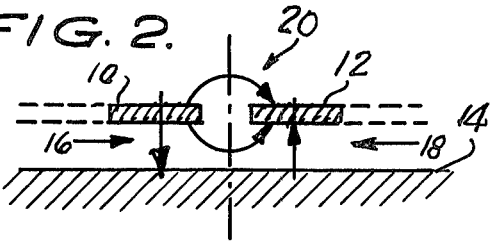
FIG. 2.
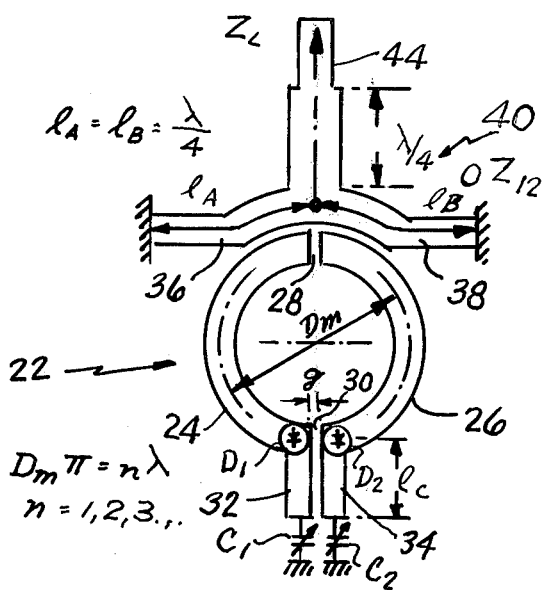
FIG. 3.
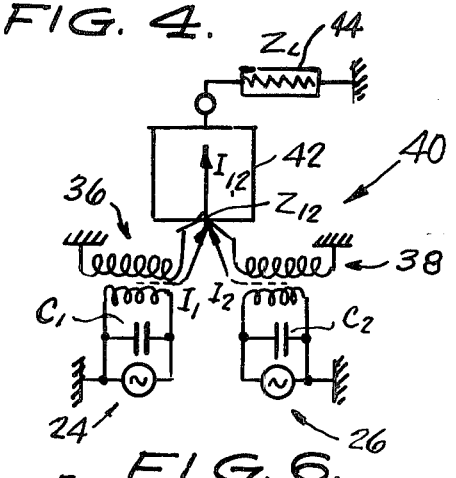
FIG. 4.
FIG. 6.
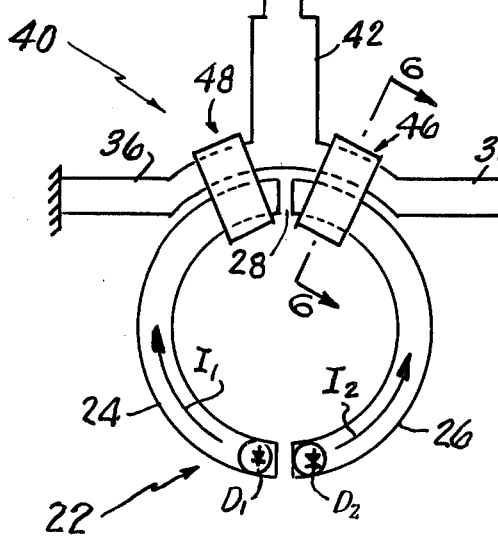
FIG. 5.
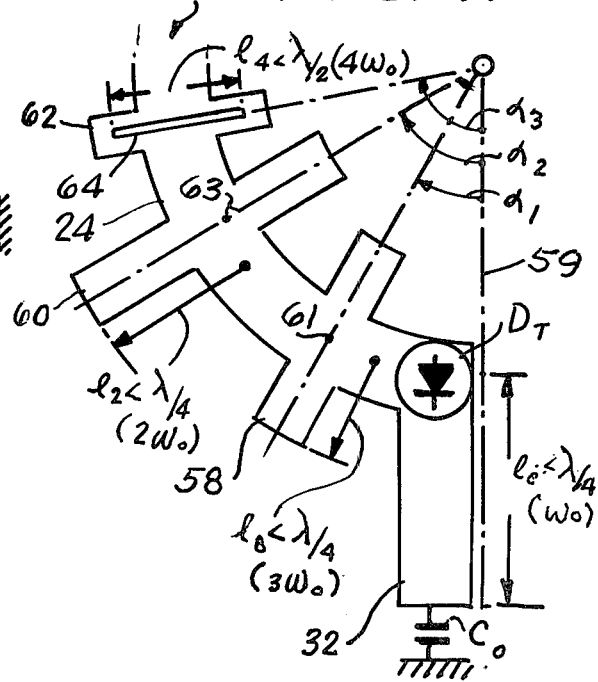
FIG. 7.

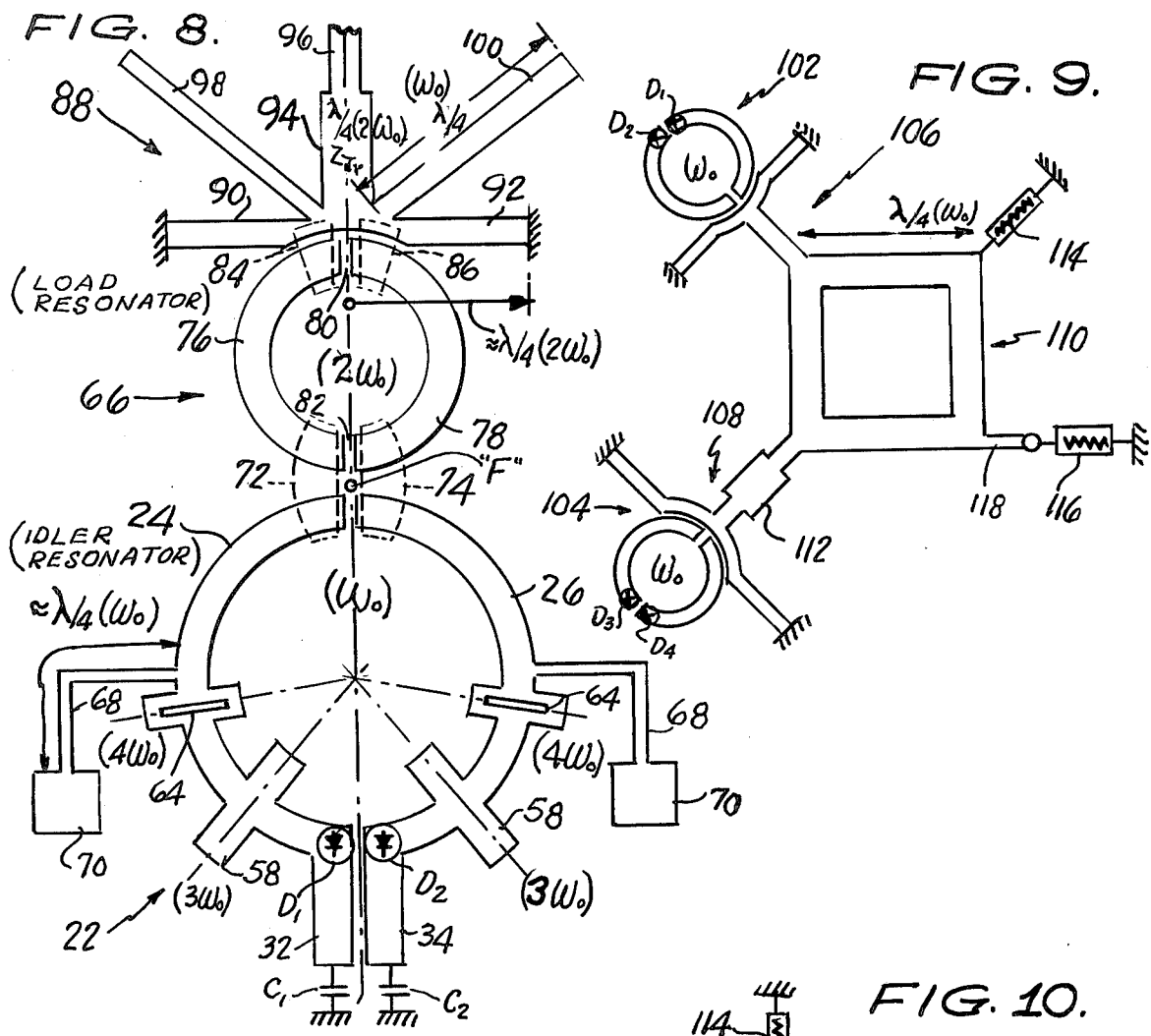

MICROSTRIP OPEN RING RESONATOR OSCILLATORS

RIGHTS OF THE GOVERNMENT

The invention described herein may be manufactured, used, and licensed by or for the United States Government for governmental purposes without the payment to me of any royalty thereon.

BACKGROUND OF THE INVENTION

1. Field of the Invention

The present invention is related to microwave integrated circuits (MICs) and, more particularly, is directed towards MICs configured as open ring resonators and which use active elements as driving means.

2. Description of the Prior Art

The TRAPATT diode is a high efficiency and high power solid state device which was iscovered by H. J. Prager et al in 1967 (*Proc. IEEE*, Volume 55, pages 586–587).

Since then, it has been analyzed by many researchers, and is now usefully applied in either a pulsed mode or a CW mode. Recently, the TRAPATT diode has found many system applications, such as in phased antenna arrays, radars, and the like. See, for example, M. . Grace in *European Microwave Conference Digest* (1961), Stockholm, Sweden, and A. Rosen et al in *RCA Review*, Volume 33, No. 4 (1972).

The TRAPATT diode oscillator or amplifier circuits, exemplified in the above-cited literature, suffer from several deficiencies. For example, they are often too complex, being either bulky when used with coaxial line, or too inefficient because of excess losses in common linear microstrip circuits.

Additionally, especially for a TRAPATT oscillator, harmonic reactive (i.e., lossless) tuning requirements must be satisfied for TRAPATT mode initiation and reasonably efficient operation; this requires at least up to the fourth harmonic to be considered.

In coaxial circuits, the tuning typically necessitates the use of multi-slugs with selected characteristic impedances and critical spacing, as pointed out by W. J. Evans in *IEEE, MTT TRANS.*, Volume 12, pages 1060–1067 (1969). In a linear microstrip circuit, reactive shunt stubs of selected length and spacing are chosen, as exemplified by the above-cited article by Rosen. Other configurations utilize series and/or shunt circuits that are tuned to frequencies which are harmonically related to the TRAPATT's fundamental frequency.

In addition to the foregoing, TRAPATT circuit combining encounters considerable problems due to requirements of tuning synchronism and efficient and stable operation of the oscillators. This is of particular importance for pulsed operation, where non-synchronous tuning results in frequency jitter. A push-pull circuit arrangement has been suggested by H. Kawamoto, *Intern. MTT Symposium* (1971), but it requires careful selection of devices and tuning.

de Ronde and Shammas describe "MIC Bandfilters Using Open-Ring Resonators" in *Proc. of the Fourth European Microwave Conference*, pages 531–535 (1974) which took place in Montreux, France. In this article, the authors minimize radiation and surface wave excitation of microstrip filters by configuring same in a half-wavelength open-ring resonator.

OBJECTS AND SUMMARY OF THE INVENTION

It is therefore a primary object of the present invention to provide a novel and unique MIC open-ring resonator configuration which overcomes all of the disadvantages noted above with respect to prior art circuits.

Another object of the present invention is to provide a novel MIC open-ring resonator configuration adapted for use, in particular, with TRAPATT diodes and which increases circuit efficiency while minimizing losses.

Another object of the present invention is to provide an MIC ring resonator configuration which utilizes active driving devices, such as TRAPATT diodes, and achieves high packaging density and reduction of parasitic oscillations when encapsulated.

A still further object of the present invention is to provide an MIC power oscillator which easily combines the power from several oscillators to a common load.

An additional object of the present invention is to provide a TRAPATT oscillator and associated circuitry by means of which either the fundamental or a harmonic may be extracted, as desired.

A still further object of the present invention is to provide an MIC open ring resonator which is tunable and is driven by a TRAPATT diode and which provides a graceful degradation backup capability.

The foregoing and other objects are attained in accordance with one aspect of the present invention through the provision of a microstrip circuit which comprises first open ring microstrip resonator means including first and second substantially semi-circular microstrip lines which are electrically isolated from one another, each having first and second ends spaced from and opposing one another, respectively. The microstrip resonator means is designed to oscillate in its even mode, whereby the first and second lines oscillate independently of one another. First and second active elements having a negative resistance characteristic are coupled respectively to the first and second ends of the first and second microstrip lines. In a preferred form, the active elements comprise diodes and, in particular, comprise TRAPATT diodes.

Means are also provided for coupling out and combining the power generated in the first and second semi-circular microstrip lines. The last-named means may comprise, in a preferred form, first and second quarter wave microstrip lines connected at a common junction and respectively adjacent to but spaced from the second end of the semi-circular microstrip lines. Even more particularly, the coupling and combining means further comprises a microstrip load line and an impedance matching microstrip line connected between the common junction and the load line for delivering the combined power thereto. A dielectric overlay may connect the second ends of the semi-circular microstrip lines with the first and second quarter wave microstrip lines, respectively, to enhance coupling. The dielectric overlay is preferably metallized on its outer surface, and comprises a ceramic material.

Means may also be provided between each of the active elements and ground for tuning each of the semi-circular microstrip lines to equalize the semi-circular resonators in case the diode capacities are diffe ent. The tuning means may comprise the series connection of a selected length of microstrip and a variable capacitor.

The open ring microstrip resonator means may further include means for trapping certain harmonics while passing the fundamental frequency of the active elements. The trapping means more particularly comprises tuning means positioned along the semi-circular microstrip lines for totally reflecting the certain harmonics generated by the active elements. The tuning means may in a best mode comprise a first open circuit tuning stub across and centered about the semi-circular line having an electrical length approximately equal to a half wavelength at the frequency of the third harmonic of the fundamental, and a second stub also across and centered about the semi-circular line having a length approximately equal to a half wavelength at the frequency of the second harmonic of the fundamental. For the fourth harmonic an open slot of approximately half a wavelength across the semi-circular line is introduced in order to reflect the fourth harmonic component back to the TRAPATT diode.

Alternatively, for second harmonic extraction the trapping means includes only means for trapping the third and fourth harmonics while passing the second harmonic and the fundamental frequency. In this case, a second open ring microstrip resonator is positioned between the first means and the coupling and combining means and is designed to resonate at the second harmonic for passing same to the coupling and combining means while filtering the fundamental and serves as a load resonator whereas the first means generating the second harmonic and fundamental serves as an idler resonator. The second open ring resonator more particularly may comprise third and fourth substantially semi-circular microstrip lines electrically isolated from one another and each having first and second ends spaced from and opposing one another, respectively, the first ends of the second means being adjacent to the second ends of the first means, the second ends of the second means being electrically coupled to the coupling and combining means. The last-named means further preferably includes means for rejecting any leaking fundamental frequency components which may have inadvertently passed through the second open ring resonator. In a preferred form, the rejecting means comprises a pair of symmetrically positioned open circuit stubs each of an electrical length approximately equal to a quarter wavelength at the fundamental frequency.

In accordance with another aspect of the present invention, a second open ring resonator means, substantially identical to the first resonator means, is driven by third and fourth active elements, and the power output from the second resonator means is coupled and combined in a second circuit means. Third means are coupled to the first and second circuit means for combining the power outputs from the first and second open ring resonators and delivering same to a load.

In one form, the third means comprises a quadrature hybrid coupler. In an alternative embodiment, the third means comprises a substantially circular microstrip line, the first and second circuit means being connected to the circular microstrip line and separated by a quarter wavelength at the fundamental frequency. In a still alternative embodiment, the third means comprises a power combining circuit having two substantially identical branches, each of which includes a quarter wavelength impedance matching line connected to receive the respective power outputs from the first and second circuit means and a perpendicular quarter wavelength line, the latter terminating at a power combining junction which is connected to a load.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which:

FIGS. 1 and 2 are diagrams helpful in understanding the even and odd mode of operation of MICs;

FIG. 3 is a plan view of a preferred embodiment of a microstrip circuit in accordance with the present invention;

FIG. 4 is a schematic diagram which is an equivalent circuit of the preferred embodiment illustrated in FIG. 3;

FIG. 5 is a view of the portion of the preferred embodiment illustrated in FIG. 3 but with a modification;

FIG. 6 is a cross-sectional view of the modification illustrated in FIG. 5 and taken along line 6—6 thereof;

FIG. 7 is an enlarged, partial view of an alternate arrangement for a portion of the preferred embodiment of the present invention;

FIG. 8 is a plan view of an alternate embodiment for secod harmonic power extraction of the present invention;

FIG. 9 is a plan view of yet another alternate preferred embodiment of the present invention;

FIG. 10 is a plan view of an alternative embodiment of the present invention;

DETAILED DESCRIPTION OF THE PREFERRED EMBODIMENTS

Figure 12:
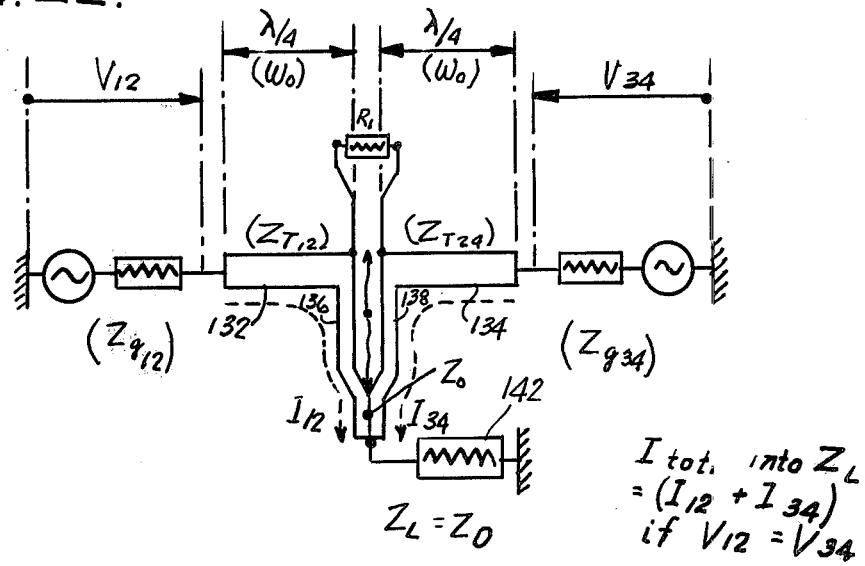
FIG. 12 is a partial equivalent circuit diagram for the configuration illustrated in FIG. 11.

Referring now to the drawings, wherein like reference numerals represent identical or corresponding parts throughout the several views, and more particularly to FIGS. 1 and 2, there is respectively illustrated a pair of microstrip transmission lines 10 and 12 positioned over a ground plane 14. The direction of the electric field between line 10 and the ground plane 14 is indicated in FIGS. 1 and 2 by reference numeral 16, while the E-field between line 12 and ground plane 14 is indicated generally by reference numeral 18. Reference numeral 20 in FIG. 2 indicates schematically the E-field distribution between adjacent microstrip lines 10 and 12.

It may be appreciated that, in FIG. 1, lines 10 and 12 are de-coupled, and this configuration is referred to gnerally as the "even" mode of operation. In FIG. 2, however, lines 10 and 12 are clearly coupled to one another via field 20, and this configuration or mode of operation is referred to as the "odd" mode.

In the present invention, utilization is made of the de-coupled even mode of operation in conbination with a modified MIC ring resonator to provide two independently oscillating resonator sections whose power may be combined and coupled to a common load. Generally indicated in FIG. 3 by reference numeral 22 is a modified open ring microstrip resonator which more particularly comprises dual oscillating ring sections 24 and 26. The resonator 22 is conventionally mounted on a dielectric substrate and ground plane (not shown).

Ring section 24 comprises a substantially semi-circular microstrip line having one end connected to and being driven by an active element, such as a diode $D_1$. While the active element $D_1$ may in fact comprise any active element having a negative resistance region, and therefore capable of generating power, in a best mode, diode $D_1$ comprises a TRAPATT diode connected between ring section 24 and the ground plane.

The symmetrical ring section 26 also comprises a semi-circular microstrip line having one end thereof driven by an active element $D_2$, which in a preferred form comprises a TRAPATT diode connected between ring section 26 and the ground plane.

Reference numeral 30 indicates a standard gap, having a gap width g, between the two first ends of the microstrip ring sections 24 and 26. In order for the open ring microstrip resonator 22 to operate in its even mode, an additional gap 28 is provided to define second ends of the ring sections 24 and 26. The gap 28 provides de-coupling between the respective ring sections 24 and 26 to enable same to oscillate independently.

Impedance matching microstrip sections 32 and 34 are connected to diodes $D_1$ and $D_2$, and variable tuning capacitors $C_1$ and $C_2$ are respectively connected between lines 32 and 34 and ground. With ring sections 24 and 26 ideally symmetrically tuned, the de-coupling therebetween would be infinite, disregarding wave propagation in the dielectric substrate. Typically measured de-coupling between sections 24 and 26 is about fifteen to twenty dB. Since the diode-driven ring sections 24 and 26, in a symmetrically tuned condition, are de-coupled, the TRAPATT diodes $D_1$ and $D_2$ are oscillating substantially independently, i.e., if diode $D_1$ is inoperable, diode $D_2$ is still able to operate, which means that the configuration of FIG. 3 is capable of what might be referred to as graceful degradation.

The power generated by diodes $D_1$ and $D_2$ in ring sections 24 and 26 is coupled to a load circuit indicated generally by reference numeral 40. The load circuit includes a pair of microstrip lines 36 and 38 each of which are approximately a quarter wavelength at the fundamental frequency of the diodes $D_1$ and $D_2$. The arms 36 and 38 meet at a common junction adjacent but spaced from the gap 28, and are short circuited at their other ends. Extending from the common junction of arms 36 and 38 is an impedance matching load line 42 which is also preferably a quarter wavelength long. The current in the load line 42 is the combined current from the individual ring sections 24 and 26. Reference numeral 44 indicates a load of, for example, fifty ohms.

The circuit of FIG. 3 has demonstrated that the generated output power in load circuit 40 corresponds to about twice of that generated by one of the diodes $D_1$ or $D_2$. This, of course, indicates that the combining efficiency of the preferred embodiment illustrated in FIG. 3 is extremely high.

As a result of the configuration of the ring resonators 22, the E-field and the H-field are essentially confined to the ring. This results in small rf radiation losses which, in turn, contributes to an increase in circuit efficiency in contrast with a straight-line or linear MIC layout. The dielectric losses of the substrate (which may comprise, for example, $Al_2O_3$) are relatively low compared with the conduction losses. The latter, however, may be kept to a minimum by selecting proper circuit and substrate dimensions to optimize impedance. The ring resonator arrangement of the present invention additionally provides the advantage of having a fairly high packaging density, and also reduces parasitic oscillations when encapsulated.

Referring now to FIGS. 5 and 6, there is illustrated by reference numerals 46 and 48 a means for enhancing the coupling between the ring resonators 22 and the load circuit 40. The means comprises a pair of overlays 46 and 48 which comprise, as seen in a cross-sectional view in FIG. 6, a dielectric 50 (e.g. ceramic), over which a metallized layer 52 is plated. The dielectric 50 is positioned over the end portion of ring section 26 and its associated output coupling arm 38. Reference numeral 54 in FIG. 6 indicates the dielectric substrate of the circuit, while reference numeral 56 indicates the ground plane plated on the other side of the dielectric 54.

The provision of overlays 46 and 48, as illustrated in FIG. 5 and 6, is a technique which may be utilized in conjunction with any of the circuits to be described hereinafter.

FIG. 7 indicates schematically an enlarged section of one of the ring resonators, such as ring section 24, which is particularly designed for use with a TRAPATT diode $D_T$ at its fundamental frequency $\omega_0$. More particularly, the ring section 24 of FIG. 7 is adapted to trap the second, third and fourth harmonics, while passing only the fundamental frequency $\omega_0$ to the load. Note that the TRAPATT diode $D_T$ is connected to a length of microstrip line 32 which is somewhat less than a quarter wavelength at the fundamental frequency and which, in turn, is connected to a tuning capacitor $C_0$ which is utilized to tune the TRAPATT diode $D_T$ to its fundamental. Positioned at an angle $\alpha_1$ with respect to the symmetrical axis 59 of the ring section 24 is a quarter wavelength open circuit tuning stub 58 which, in effect, produces a short at point 61 so that any third harmonic generated by the TRAPATT diode $D_T$ get totally reflected at point 61 back to the source.

Similarly, angle $\alpha_2$ provides a certain electrical length along ring section 24 where the reactance for the second harmonic $(2\omega_0)$ is a minimum. A second tuning stub 60, having an electrical length from point 63 equal to a quarter wavelength at the second harmonic, or an overall electrical length of a half wavelength, produces an effective short circuit at point 63 so that the second harmonic content produced by TRAPATT diode $D_T$ is totally reflected back to the source.

In a like fashion, a third tuning stub 62 is positioned at an angle $\alpha_3$ from the axis 59 where the reactance for the fourth harmonic $(4\omega_0)$ is a minimum. The trap for the fourth harmonic is, however, a half wavelength slot-resonator 64, rather than an open circuit stub, in order to prevent the fourth harmonic from being resistively loaded.

Accordingly, stubs 58, 50 and 62 respectively reject the third, second and fourth harmonics, and pass the fundamental through point 65 to the load circuit.

Since the produced TRAPATT diode waveform has a very high harmonic content, a modification of the harmonic trap circuit of FIG. 7 can be utilized to achieve harmonic power extraction. Referring to FIG. 8, there is illustrated a circuit which is utilized to extract the second harmonic component produced by the TRAPATT diodes $D_1$ and $D_2$. Reference numeral 22 again illustrates an even mode dual ring resonator circuit which can be referred to in this configuration as an idler circuit. Idler circuit 22 oscillates at the fundamental frequency $\omega_0$ produced by the TRAPATT diodes $D_1$ and $D_2$. Provided in each of the ring sections 24 and 26 are harmonic traps 58 and 64 for the third and fourth harmonics. Thus, the dual ring resonators 22 serve to pass only the fundamental and the second harmonic.

In FIG. 8, a bias circuit for each of the diodes $D_1$ and $D_2$ includes a quarter wavelength choke 68 for the fundamental frequency and a capacitor patch 70, which is a very low reactance (almost a short) whose dimensions must be small compared to the wavelength of the fourth harmonic for the illustrated configuration in order to avoid parasitic resonances. Interposed between the load circuit 88 and the dual ring resonators 22 is a load circuit 66 which also comprises a pair of semi-circular ring sections 76 and 78 separated at their upper and lower portions respectively by gaps 80 and 82. The ends of ring sections 76 and 78 formed by gap 82 may be coupled to the ends of ring sections 24 and 26 formed by gap 28 by means of overlays 72 and 74, respectively. The load circuit 66 is designed to resonate at the second harmonic ($2\omega_0$) so as to basically reject the fundamental frequency and pass the second harmonic.

The utilization load circuit 88 is of the standard configuration in including a pair of quarter wavelength shorting stubs 90 and 92 and a combined microstrip load line 94, also of a quarter wavelength at the second harmonic. The output line is indicated by reference numeral 96 for impedance matching purposes.

Circuit 88 also preferably includes a pair of symmetrically positioned open circuit stubs 98 and 100 which are of a quarter wavelength at the fundamental frequency $\omega_0$. The stubs 98 and 100 are designed to reject any remaining stray fundamentals so that the output 96 receives only the second harmonic content.

Figure 11:
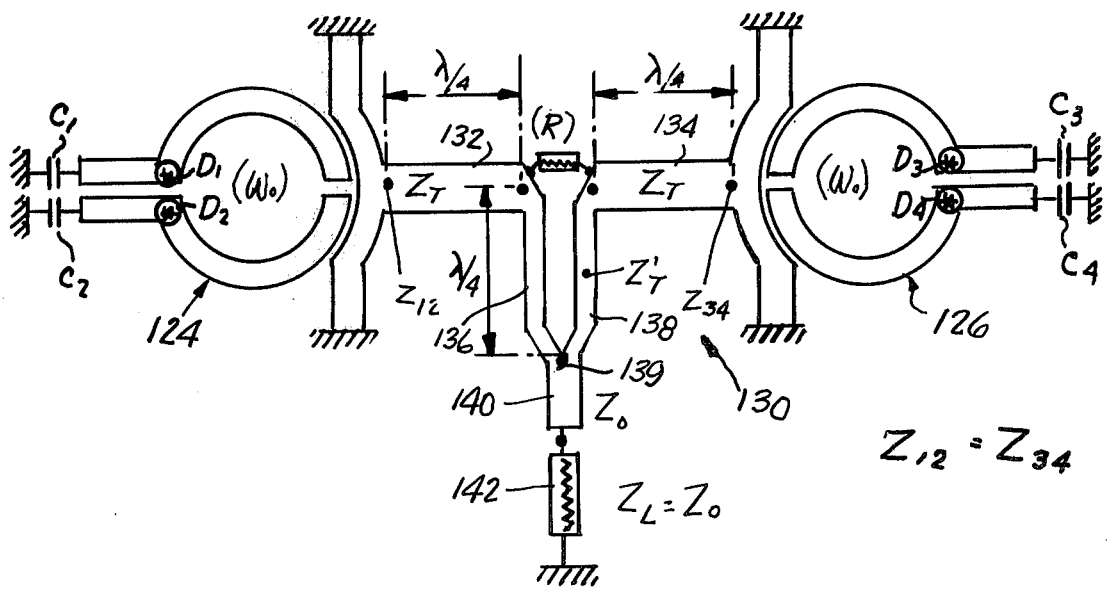
FIG. 11 is a plan view of yet another alternate embodiment in accordance with the present invention.

FIGS. 9, 10 and 11 illustrate various configurations for combining the power output of more than one of the dual ring resonators, each of the latter combining the power from two TRAPATT diodes. For example, in FIG. 9, reference numerals 102 and 104 indicate a pair of dual ring-section resonators driven respectively by diodes $D_1$, $D_2$ and $D_3$, $D_4$, whose combined power outputs are received in load circuits 106 and 108, respectively. Resonator circuits 102 and 104 may be, for example, identical to the circuits of FIG. 3, as modified by FIG. 7 if fundamental extraction is desired, or of FIG. 8, if harmonic extraction is desired.

The outputs from load circuits 106 and 108 are fed to a quadrature hybrid coupler 110 having four quarter wavelength symmetrical legs. Load circuits 106 and 108 feed to adjacent corners of the coupler 110, and the output from coupler 110 is indicated by reference numeral 118. The difference in positioning between oscillators 102 and 104 is compensated by provision of a phase-shifter 112 between the output of load 108 and coupler 110. At the fourth leg of coupler 110 is provided a fifty ohm termination 114, so that the combined power from diodes $D_1$, $D_2$, $D_3$ and $D_4$ is fed to load 116.

In FIG. 10 the quadrature hybrid coupler 110 of FIG. 9 is replaced by a circular strip line configuration which includes segments 120 and 122. The configuration of FIG. 10 is also known as a "rat race" circuit. Note that the outputs of circuits 106 and 108 are separated by a quarter wavelength at the fundamental, and the circuit is in other respects analogous to that illustrated in FIG. 9.

FIG. 11 differs from the circuits of FIGS. 9 and 10 in representing a paralleling of two dual resonator units 124 and 126, where both sources are separated by a half wavelength. The load 142 is, however, seen by each source through a quarter wavelength line isolation section 136 and 138, respectively, provided that sections 136 and 138 are symmetric. If the sections are symmetric in impedance, they are isolated from one another, and the power of each source may be fed to a common output load, as indicated by the equivalent diagram in FIG. 12.

The quarter wavelength load lines 132 and 134 are analogous to the microstrip section 42 of the FIG. 3 circuit, and point 139 defines a junction between the isolation sections 136 and 138 where the current from the four diodes $D_1$ through $D_4$ are combined.

Obviously, numerous modifications and variations of the present invention are possible in light of the above teaching. It is therefore to be understood that within the scope of the appended claims, the invention may be practiced otherwise than as specifically described herein.

I claim as my invention:

1. A microstrip circuit, which comprises:
   first open ring microstrip resonator means for oscillating in its even mode and including first and second substantially semi-circular de-coupled microstrip lines electrically isolated and adapted to oscillate independently from one another and each having first and second ends spaced from and opposing one another, respectively.

2. A microstrip circuit, which comprises:
   first open ring microstrip resonator means including first and second substantially semi-circular microstrip lines electrically isolated from one another and each having first and second ends spaced from and opposing one another, respectively; and
   further comprising first and second active elements having a negative resistance characteristic and coupled respectively to said first ends of said first and second microstrip lines.

3. The microstrip circuit as set forth in claim 2, wherein said first open ring microstrip resonator means is mounted on a dielectric substrate and ground plane, and wherein said first and second active elements are connected respectively between said first ends of said first and second microstrip lines and said ground plane.

4. The microstrip circuit as set forth in claim 2, further comprising first circuit means for coupling out and combining the power generated in said first and second microstrip lines.

5. The microstrip circuit as set forth in claim 4, wherein said coupling and combining circuit means comprises first and second quarter wave microstrip lines connected at a common junction and respectively adjacent to but spaced from said second ends.

6. The microstrip circuit as set forth in claim 5, wherein said coupling and combining means further comprises a microstrip load line and an impedance matching microstrip line connected between said common junction and said load line for delivering the combined power thereto.

7. The microstrip circuit as set forth in claim 2, further comprising means connected between each of said active elements and ground for tuning each of said semi-circular microstrip lines.

8. The microstrip circuit as set forth in claim 7, wherein said tuning means each comprise the series connection of a selected length of microstrip and a variable capacitor.

9. The microstrip circuit as set forth in claim 5, wherein said coupling and combining circuit means further comprises dielectric overlay means for connecting said second ends of said semi-circular microstrip line with said first and second quarter wave microstrip lines, respectively.

10. The microstrip circuit as set forth in claim 9, wherein said dielectric overlay is metallized on its outer surface.

11. The microstrip circuit as set forth in claims 9 or 10, wherein said dielectric overlay comprises a ceramic material.

12. The microstrip circuit as set forth in claim 4, wherein said open ring microstrip resonator means further includes means for trapping certain harmonics while passing at least the generated power at the fundamental frequency of said active elements.

13. The microstrip circuit as set forth in claim 12, wherein said trapping means comprises tuning means positioned along said semi-circular microstrip lines for totally reflecting said certain harmonics generated by said active elements.

14. The microstrip circuit as set forth in claim 13, wherein said tuning means comprises a first open circuit tuning stub across said semi-circular line having an electrical length approximately equal to a half-wavelength at the frequency of the third harmonic of the fundamental frequency of said active elements.

15. The microstrip circuit as set forth in claim 14, wherein said tuning means further comprises a second stub having an open slot of a length approximately equal to a half-wavelength at the frequency of the fourth harmonic of the fundamental frequency of said active elements.

16. The microstrip circuit as set forth in claim 15, wherein said tuning means further comprises a third open circuit tuning stub positioned across said line between said first and second stubs and having an electrical length approximately equal to a half-wavelength at the frequency of the second harmonic of the fundamental frequency of said active elements.

17. The microstrip circuit as set forth in claims 12 or 15, wherein said trapping means includes means for trapping the third and fourth harmonics while passing the second harmonic and said fundamental frequency.

18. The microstrip circuit as set forth in claim 17, further comprising second open ring microstrip resonator means positioned between said first resonator means and said coupling and combining means and designed to resonate at said second harmonic for passing same to said coupling and combining means.

19. The microstrip circuit as set forth in claim 18, wherein said second open ring resonator means comprises third and fourth substantially semi-circular microstrip lines electrically isolated from one another and each having first and second ends spaced from and opposing one another, respectively, said first ends of said second resonator means being adjacent to said second ends of said first resonator means, said second ends of said second resonator means being electrically coupled to said coupling and combining means.

20. The microstrip circuit as set forth in claim 19, wherein said coupling and combining circuit means comprises first and second quarter wave microstrip lines connected at a common junction and respectively adjacent to but spaced from said second ends of said second resonator means.

21. The microstrip circuit as set forth in claim 20, wherein said coupling and combining means further comprises means for rejecting any stray fundamental frequency components.

22. The microstrip circuit as set forth in claim 21, wherein said rejecting means comprises a pair of symmetrically positioned open circuit stubs each of an electrical length approximately equal to a quarter wavelength at said fundamental frequency.

23. The microstrip circuit as set forth in claim 4, further comprising second open ring resonator means substantially identical to said first resonator means and driven by third and fourth active elements, the output power from said second resonator means being coupled and combined in second circuit means; and third means coupled to said first and second circuit means for combining the power outputs therefrom and delivering same to a load.

24. The microstrip circuit as set forth in claim 23, wherein said third means comprises a quadrature hybrid coupler.

25. The microstrip circuit as set forth in claim 23, wherein said third means comprises a substantially circular microstrip line, said first and second circuit means being connected to said circular microstrip line and separated by a quarter wavelength at the fundamental frequency.

26. The microstrip circuit as set forth in claim 23, wherein said third means comprises a power combining circuit having two branches, each branch including a quarter wavelength impedance matching line connected to receive the respective power outputs from said first and second circuit means and a perpendicular quarter wavelength line, the latter terminating at a power combining junction which is connected to a load.

27. The microstrip circuit as set forth in claims 2, 8, 12, 15 or 23, wherein said active elements comprise diodes.

28. The microstrip circuit as set forth in claims 2, 8, 12, 15 or 23, wherein said active elements each comprise a TRAPATT diode.

* * * * *